United States Patent
Aoki et al.

(10) Patent No.: US 7,067,398 B2
(45) Date of Patent: Jun. 27, 2006

(54) METHOD OF PRODUCING ELECTRONIC CIRCUIT AND ELECTRONIC CIRCUIT

(75) Inventors: Hideo Aoki, Yokohama (JP); Naoko Yamaguchi, Yokohama (JP); Chiaki Takubo, Tokyo (JP); Toshiaki Yamauchi, Fujisawa (JP); Koji Imamiya, Kawasaki (JP); Hiroshi Hashizume, Hino (JP)

(73) Assignees: Kabushiki Kaisha Toshiba, Tokyo (JP); Toshiba TEC Corporation, Tokyo (JP)

( * ) Notice: Subject to any disclaimer, the term of this patent is extended or adjusted under 35 U.S.C. 154(b) by 0 days.

(21) Appl. No.: 11/103,464

(22) Filed: Apr. 12, 2005

(65) Prior Publication Data

US 2005/0224931 A1    Oct. 13, 2005

(30) Foreign Application Priority Data

Apr. 13, 2004  (JP)  ............................ P2004-118122

(51) Int. Cl.
    *H01L 21/283*  (2006.01)
(52) U.S. Cl. ..................... 438/466; 438/670; 438/951
(58) Field of Classification Search ............... 427/98.5, 427/118; 438/670, 466, 951, FOR. 347
    See application file for complete search history.

(56) References Cited

U.S. PATENT DOCUMENTS

| 4,327,167 A * | 4/1982 | Tanabe ........................ 430/31 |
| 4,585,319 A | 4/1986 | Okamoto et al. |
| 4,588,617 A | 5/1986 | Oka |
| 4,696,861 A | 9/1987 | Tatematsu et al. |
| 4,897,326 A | 1/1990 | Marengo |
| 6,214,508 B1 | 4/2001 | Kamada et al. |
| 6,294,404 B1 * | 9/2001 | Sato ........................... 438/106 |
| 6,348,295 B1 * | 2/2002 | Griffith et al. ............... 430/198 |
| 6,403,272 B1 * | 6/2002 | Kamada et al. .......... 430/108.6 |
| 6,440,625 B1 | 8/2002 | Berlin |
| 6,524,758 B1 | 2/2003 | Eberlein et al. |
| 2001/0006756 A1 * | 7/2001 | Kamada et al. .......... 430/108.7 |

(Continued)

FOREIGN PATENT DOCUMENTS

JP    07-263841    10/1995

(Continued)

OTHER PUBLICATIONS

Yamaguchi, et al., "New Process of Manufacturing Printed Circuit Boards Using Electrophotography Technology", 2004 ICEP Proceedings, pp. 168-172, (Apr., 2004).

*Primary Examiner*—George Fourson
(74) *Attorney, Agent, or Firm*—Finnegan, Henderson, Farabow, Garrett & Dunner, L.L.P.

(57) ABSTRACT

According to an embodiment of the present invention, a method of producing an electronic circuit comprises printing first metal-containing resin particles which consist of at least a thermosetting resin and fine metal particles and second metal-containing resin particles which consist of at least a thermoplastic resin and fine metal particles by electrophotography to form a first base pattern which consists of the first metal-containing resin particles and a second base pattern which consists of the second metal-containing resin particles on a substrate; forming a first metal conductor layer on the first and second base patterns; forming a second metal conductor layer on the first metal conductor layer by electrolytic plating by supplying electric current to the first metal conductor layer; and removing the second base pattern and the first and second metal conductor layers which are formed on the second base pattern.

4 Claims, 14 Drawing Sheets

U.S. PATENT DOCUMENTS

| | | |
|---|---|---|
| 2004/0035605 A1* | 2/2004 | Griffith et al. .............. 174/257 |
| 2004/0169470 A1* | 9/2004 | Inoue ........................ 313/582 |
| 2004/0197487 A1 | 10/2004 | Aoki et al. |
| 2005/0053772 A1 | 3/2005 | Aoki et al. |
| 2005/0227158 A1* | 10/2005 | Yamauchi et al. ....... 430/108.1 |

FOREIGN PATENT DOCUMENTS

| | | |
|---|---|---|
| JP | 08-056077 | 2/1996 |
| JP | 2001-284769 | 10/2001 |
| WO | WO2004013922 A * | 2/2004 |

* cited by examiner

METHOD OF PRODUCING ELECTRONIC CIRCUIT AND ELECTRONIC CIRCUIT

CROSS-REFERENCE TO THE INVENTION

This application is based upon and claims the benefit of priority from the prior Japanese Patent Application No. 2004-118122, filed on Apr. 13, 2004; the entire contents of which are incorporated herein by reference.

BACKGROUND OF THE INVENTION

1. Field of the Invention

The present invention relates to a method of producing an electronic circuit and an electronic circuit.

2. Description of the Related Art

In producing a conventional electronic circuit board, a metal conductor pattern layer is formed on a metal thin film by performing resist application, exposure, development, etching and other processes. This manufacturing step requires an exposure mask for each layer, involving a great amount of time and cost for its design and production. Therefore, a change or modification in the circuit pattern has a large influence on the electronic circuit board production period and cost.

Accordingly, there is developed a method of forming a metal conductor layer without using an exposure mask by printing a base pattern having a desired pattern by electrophotography with charged particles containing fine metal particles in a resin used as toner, and performing electroless plating with the fine metal particles of the printed base pattern used as a plating nucleus (Japanese Patent Laid-Open Application No. Hei 7-263841).

The metal conductor layer needs a prescribed thickness according to a required electric resistance value. Generally, a thickness of 10 to 20 μm is required. Here, a metal deposition speed is about 1 to 2 μm/h in the electroless plating, and it takes five hours or more to form a metal conductor pattern having a thickness of 10 μm by electroless plating. Meanwhile, it takes about 10 minutes only to form a metal conductor layer having the same thickness by electrolytic plating because a metal deposition speed is about 1 μm/min in the electrolytic plating.

Thus, it is desired to form the metal conductor layer by electrolytic plating. Where the metal conductor layer is formed on the pattern by electrolytic plating, it is necessary to supply electric current to all patterns. However, because an ordinary pattern is used as an electric circuit, the overall circuit is mostly an assembly of electrically independent patterns. The electrolytic plating treatment can be performed by supplying electric current to the patterns on which electrolytic plating is deposited and which are mutually connected electrically by plating wires. However, an unnecessary plating wire must be removed after forming the metal conductor layer having a thickness of about 10 to 20 μm. When the pattern is formed of a single layer, the plating wires are drawn to the outer periphery of the circuit, and the circumferential portion may be cut finally. However, where the circuit board is multilayered, it is impossible to remove the plating wires only.

BRIEF SUMMARY OF THE INVENTION

According to an aspect of the present invention, there is provided a method of producing an electronic circuit, comprising printing first metal-containing resin particles which consist of at least a thermosetting resin and fine metal particles and second metal-containing resin particles which consist of at least a thermoplastic resin and fine metal particles by electrophotography to form a first base pattern which consists of the first metal-containing resin particles and a second base pattern which consists of the second metal-containing resin particles on a substrate; forming a first metal conductor layer on the first and second base patterns; forming a second metal conductor layer on the first metal conductor layer by electrolytic plating by supplying electric current to the first metal conductor layer; and removing the second base pattern and the first and second metal conductor layers which are formed on the second base pattern.

According to another aspect of the present invention, there is provided a method of producing an electronic circuit, comprising printing first metal-containing resin particles which consist of at least a first resin and fine metal particles and second metal-containing resin particles which consist of either a second resin having wettability with respect to a substrate relatively lower than that of the first resin or a mixture containing a resin and oils and fats, and fine metal particles by electrophotography to form a first base pattern which consists of the first metal-containing resin particles and a second base pattern which consists of the second metal-containing resin particles on the substrate; forming a first metal conductor layer on the first and second base patterns; forming a second metal conductor layer on the first metal conductor layer by electrolytic plating by supplying electric current to the first metal conductor layer; and removing the second base pattern and the first and second metal conductor layers which are formed on the second base pattern.

According to another aspect of the present invention, there is provided a method of producing an electronic circuit, comprising treating the surface of at least either of a circuit forming region of a substrate and a plating wire forming region of the substrate to make wettability of the plating wire forming region with respect to a resin lower than that of the circuit forming region; printing metal-containing resin particles which consist of at least the resin and fine metal particles contained in the resin by electrophotography to form a base pattern on the circuit forming region and the plating wire forming region; forming a first metal conductor layer on the base pattern; forming a second metal conductor layer on the first metal conductor layer by electrolytic plating by supplying an electric current to the first metal conductor layer; and removing the base pattern and the first and second metal conductor layers formed on the plating wire forming region.

According to another aspect of the present invention, there is provided a method of producing an electronic circuit, comprising forming a peel pattern on a part of a substrate by using a second resin which has wettability with respect to the substrate lower than that of a first resin, or a mixture containing a resin and oils and fats; printing metal-containing resin particles which consist of at least the first resin and fine metal particles contained in the first resin by electrophotography to form a base pattern on the substrate; forming a first metal conductor layer on the base pattern; forming a second metal conductor layer on the first metal conductor layer by electrolytic plating by supplying electric current to the first metal conductor layer; and removing the peel pattern, and the base pattern and the first and second metal conductor layers which are formed on the peel pattern.

According to another aspect of the present invention, there is provided an electronic circuit, comprising a first base pattern which is formed on a substrate and consists of at least a thermosetting resin and fine metal particles contained in the thermosetting resin; a second base pattern which is formed on the substrate and consists of at least a thermoplastic resin and fine metal particles contained in the thermoplastic resin; a first metal conductor layer which is formed on the first and second base patterns; and a second metal conductor layer which is formed on the first metal conductor layer.

According to another aspect of the present invention, there is provided an electronic circuit, comprising a first base pattern which is formed on a substrate and consists of at least a first resin and fine metal particles contained in the first resin; a second base pattern which is formed on the substrate and consists of a second resin having wettability with respect to the substrate lower than that of the first resin or a mixture containing a resin and oils and fats, and fine metal particles contained in the second resin or the mixture; a first metal conductor layer which is formed on the first and second base patterns; and a second metal conductor layer which is formed on the first metal conductor layer.

According to another aspect of the present invention, there is provided an electronic circuit, comprising a substrate which has a circuit forming region and a plating wire forming region having wettability with respect to a resin lower than that of the circuit forming region; a base pattern which is formed on the circuit forming region and the plating wire forming region of the substrate and consists of at least the resin and fine metal particles contained in the resin; a first metal conductor layer which is formed on the base pattern; and a second metal conductor layer which is formed on the first metal conductor layer.

According to another aspect of the present invention, there is provided an electronic circuit, comprising a peel pattern which consists of a second resin having wettability with respect to a substrate lower than that of a first resin or a mixture containing a resin and oils and fats; a base pattern which is formed on the substrate and consists of the first resin and fine metal particles contained in the first resin; a first metal conductor layer which is formed on the base pattern; and a second metal conductor layer which is formed on the first metal conductor layer.

DETAILED DESCRIPTION OF THE INVENTION (First Embodiment)

Figure 1:
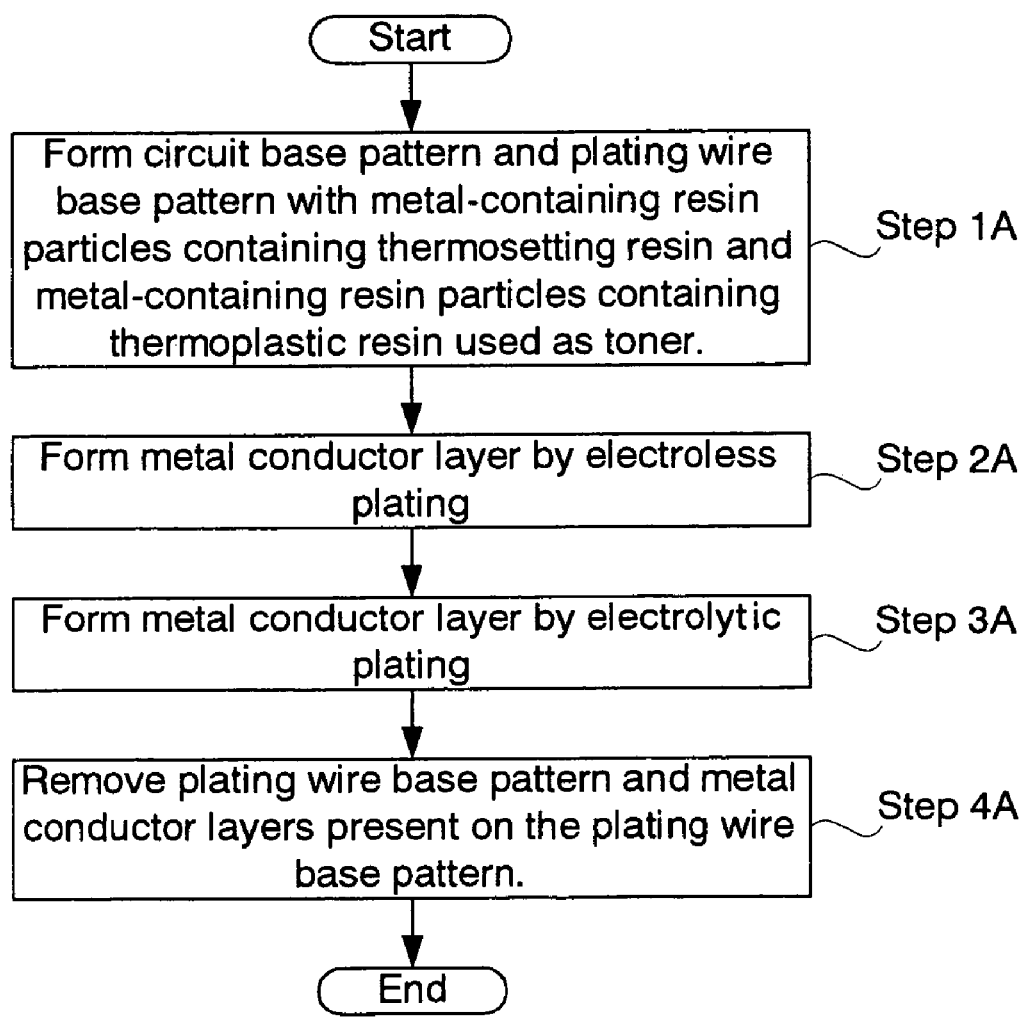
FIG. 1 is a flowchart showing a flow of manufacturing steps for the electronic circuit according to an embodiment.
Figure 5A:
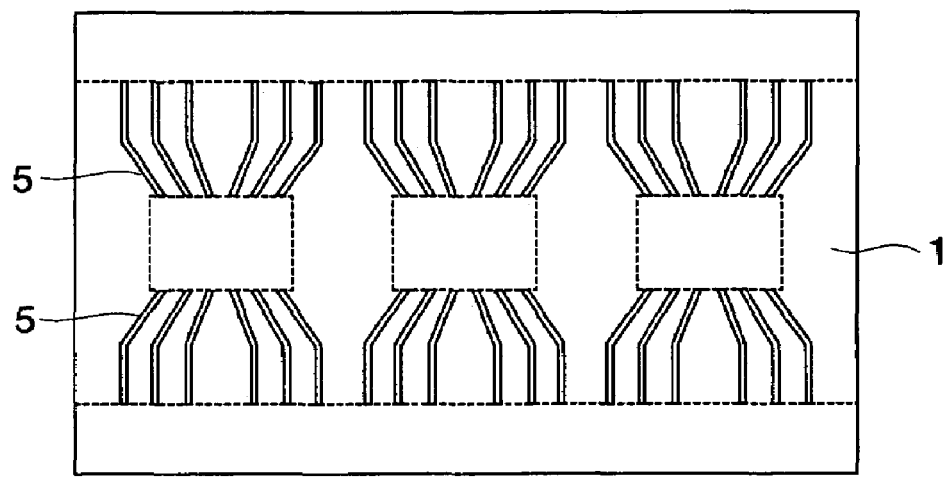
FIG. 5A and FIG. 5B are a plan view and a vertical sectional view schematically showing a manufacturing state of the electronic circuit according to the first embodiment.
Figure 5B:
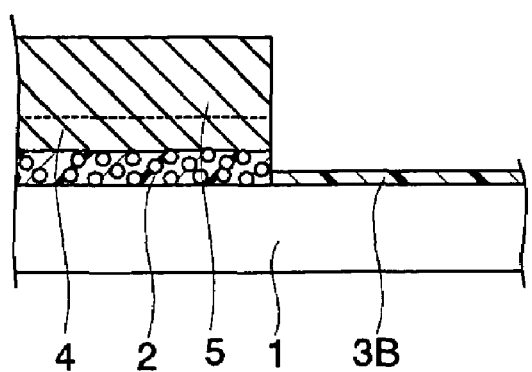
Figure 6A:
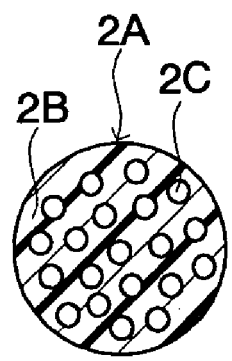
FIG. 6A and FIG. 6B are schematic views showing metal-containing resin particles according to the first embodiment.
Figure 6B:
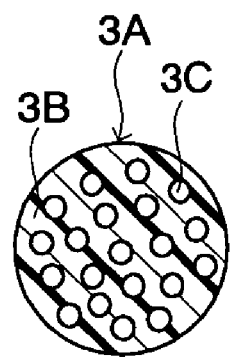

First Embodiment will be described below. FIG. 1 is a flowchart showing a flow of manufacturing steps for the electronic circuit according to this embodiment. FIG. 2A through FIG. 5B are plan views and vertical sectional views schematically showing manufacturing states of the electronic circuit according to this embodiment. FIG. 6A and FIG. 6B are schematic views of metal-containing resin particles according to this embodiment.

Figure 2A:
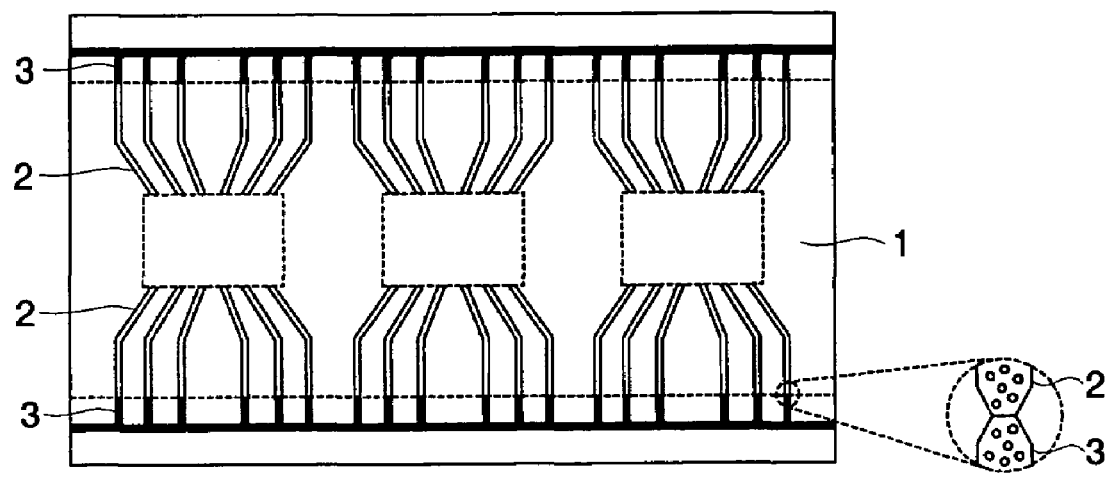
FIG. 2A and FIG. 2B are a plan view and a vertical sectional view schematically showing a manufacturing state of the electronic circuit according to a first embodiment.
Figure 2B:
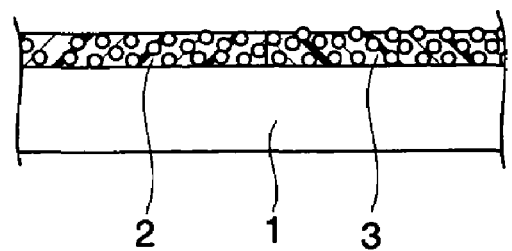

First, as shown in FIG. 1, FIG. 2A and FIG. 2B, a circuit base pattern 2 (first base pattern) for electroless plating is formed on a substrate 1 using metal-containing resin particles 2A as toner by printing according to electrophotography, and a plating wire base pattern 3 (second base pattern) for electroless plating is formed on the substrate 1 using metal-containing resin particles 3A as toner by printing according to electrophotography (step 1A). Here, the electrophotography is a method by which an electrostatic latent image is formed on the surface of a photo conductor and made visible with toner. The circuit base pattern 2 and the plating wire base pattern 3 may be formed at the same time or the circuit base pattern 2 may be formed after forming the plating wire base pattern 3.

The circuit base pattern 2 and the plating wire base pattern 3 are preferably formed such that the boundary section between the circuit base pattern 2 and the plating wire base pattern 3 is constricted as shown in FIG. 2A. As the boundary section is constricted, a stress is concentrated on the boundary section of the metal conductor layers 4, 5 (shown in FIG. 4B) when the plating wire base pattern 3 and the metal conductor layers 4, 5 formed on the plating wire base pattern 3 are peeled off, and the metal conductor layers 4, 5 can be broken easily at the boundary section. In other words, only the metal conductor layers 4, 5 described later which are formed on the plating wire base pattern 3 are easily peeled off.

The metal-containing resin particles 2A are composed of a thermosetting resin 2B and fine metal particles 2C contained in the thermosetting resin 2B as shown in FIG. 6A. Examples of the thermosetting resin 2B include a B-stage thermosetting resin which is solid at normal temperature. The B stage means a state that the thermosetting resin has at least a portion not cured but the uncured portion melts when exposed to prescribed heat. As the B-stage thermosetting resin, epoxy resin, polyimide resin, phenol resin, bismaleimide resin, cyanate ester resin, bismaleimidotriazine resin, benzicyclobutene resin, polyimide resin, polybenzoxazole resin, butadiene resin, silicone resin, polycarbodiimide resin, polyurethane resin, etc. can be used, and a charge controlling agent may be added if necessary.

It is desirable that the fine metal particles 2C have a particle diameter of 0.05 to 3 μm or less and are contained in a ratio of 15 to 70 wt %. It is more desirable that the fine metal particles 2C are contained at a ratio of 30 to 60 wt %. As the fine metal particles 2C, at least one type of fine metal particles selected from a group consisting of Pt, Pd, Cu, Au, Ni and Ag is desirably used. These fine metal particles become the core of electroless plating described later and act as a catalyst for the progress of a plating reaction. Among them, it is particularly desirable to use Pd or Cu.

The metal-containing resin particles 3A are composed of thermoplastic resin 3B and fine metal particles 3C contained in the thermoplastic resin 3B as shown in FIG. 6B. Examples of the thermoplastic resin 3B are styrene based polymer, styrene-butadiene copolymer, styrene-acrylonitrile copolymer, styrene-maleic acid copolymer, acrylic polymer, styrene-acrylic copolymer, polyethylene, ethylene-vinyl acetate copolymer, chlorinated polyethylene, polyvinyl chloride, polypropylene, vinyl chloride-vinyl acetate copolymer, polyester, alkyd resin, polyamide, polyurethane, polycarbonate, polyarylate, polysulfone, diallyl phthalate resin, ketone resin, polyvinyl butyral resin, polyether resin, etc. For the fine metal particles 3C, those same as the fine metal particles 2C can also be used.

Figure 3A:
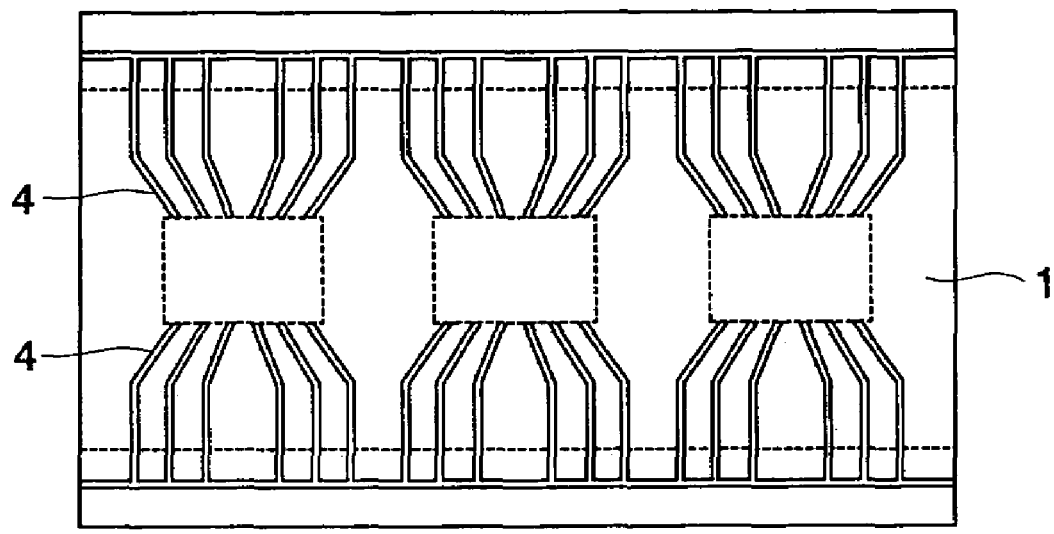
FIG. 3A and FIG. 3B are a plan view and a vertical sectional view schematically showing a manufacturing state of the electronic circuit according to the first embodiment.
Figure 3B:
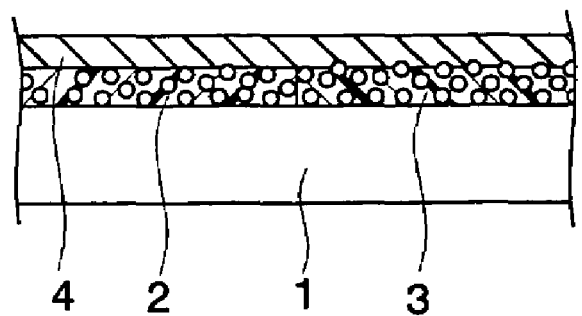

Then, an electroless plating solution is supplied onto the substrate 1, and a metal conductor layer 4 (first metal conductor layer) is formed on the circuit base pattern 2 and the plating wire base pattern 3 with the fine metal particles 2C, 3C contained in the circuit base pattern 2 and the plating wire base pattern 3 used as the nucleus by electroless plating as shown in FIG. 3A and FIG. 3B (step 2A).

Figure 4A:
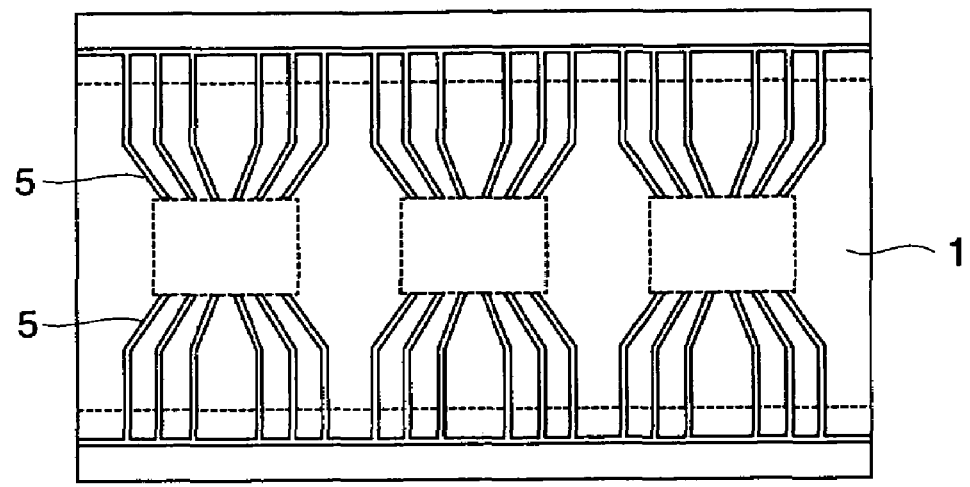
FIG. 4A and FIG. 4B are a plan view and a vertical sectional view schematically showing a manufacturing state of the electronic circuit according to the first embodiment.
Figure 4B:
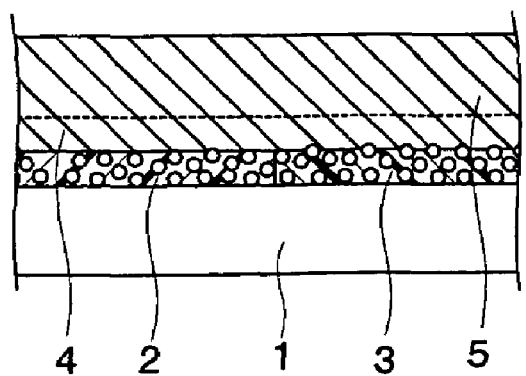

After the metal conductor layer 4 is formed on the circuit base pattern 2 and the plating wire base pattern 3, an electrolytic plating solution is supplied onto the substrate 1, and electric current is also supplied from the metal conductor layer 4 present on the circuit base pattern 2 and the plating wire base pattern 3 to form a metal conductor layer 5 (second metal conductor layer) on the metal conductor layer 4 by electrolytic plating as shown in FIG. 4A and FIG. 4B (step 3A).

After the metal conductor layer 5 is formed on the metal conductor layer 4, a heat-resistant adhesive tape or the like is applied to the entire surface of the substrate 1, the substrate 1 is heated, the adhesive tape is peeled off when the thermoplastic resin 3B melts. Thus, the plating wire base pattern 3 and the metal conductor layers 4, 5 present on the plating wire base pattern 3 are removed as shown in FIG. 5A and FIG. 5B (step 4A). In this case, the melted thermoplastic resin 3B might remain partly on the substrate 1, but it does not cause an influence on the function as the circuit because it does not have electrical continuity.

In this embodiment, the metal-containing resin particles 2A containing the thermosetting resin 2B are used to form the circuit base pattern 2, and the metal-containing resin particles 3A containing the thermoplastic resin 3B are used to form the plating wire base pattern 3. When the substrate 1 is heated, the metal conductor layer 4 which is on the circuit base pattern 2 is adhered onto the substrate 1 by the medium of the thermosetting resin 2B contained in the circuit base pattern 2, but the thermoplastic resin 3B contained in the plating wire base pattern 3 melts, so that it can be peeled off together with the metal conductor layer on the plating wire base pattern 3. Therefore, the metal conductor layers 4, 5 which are on the plating wire base pattern 3 can be removed easily, and the manufacturing period can be shortened. And, when the thermoplastic resin 3B is soluble in a solvent such as acetone, a residue and the like remaining after peeling can also be cleaned with the solvent.

In this embodiment, the metal conductor layer 4 is formed by electroless plating, then the metal conductor layer 5 is formed by electrolytic plating. Thus, the forming time of the metal conductor layer can be made shorter than when the metal conductor layer is formed by electroless plating only.

In this embodiment, the metal conductor layers 4, 5 which are present on the plating wire base pattern 3 are removed in the final step. But, for example, when the plating wire base pattern 3 is provided with a function as a lead wire for testing electrical performance of a circuit board, it is also possible to use for testing a circuit board or the like in a state that the metal conductor layers 4, 5 are present on the plating wire base pattern 3, so that it can be provided as a product in a stage before its removal.

(Second Embodiment)

Figure 7:
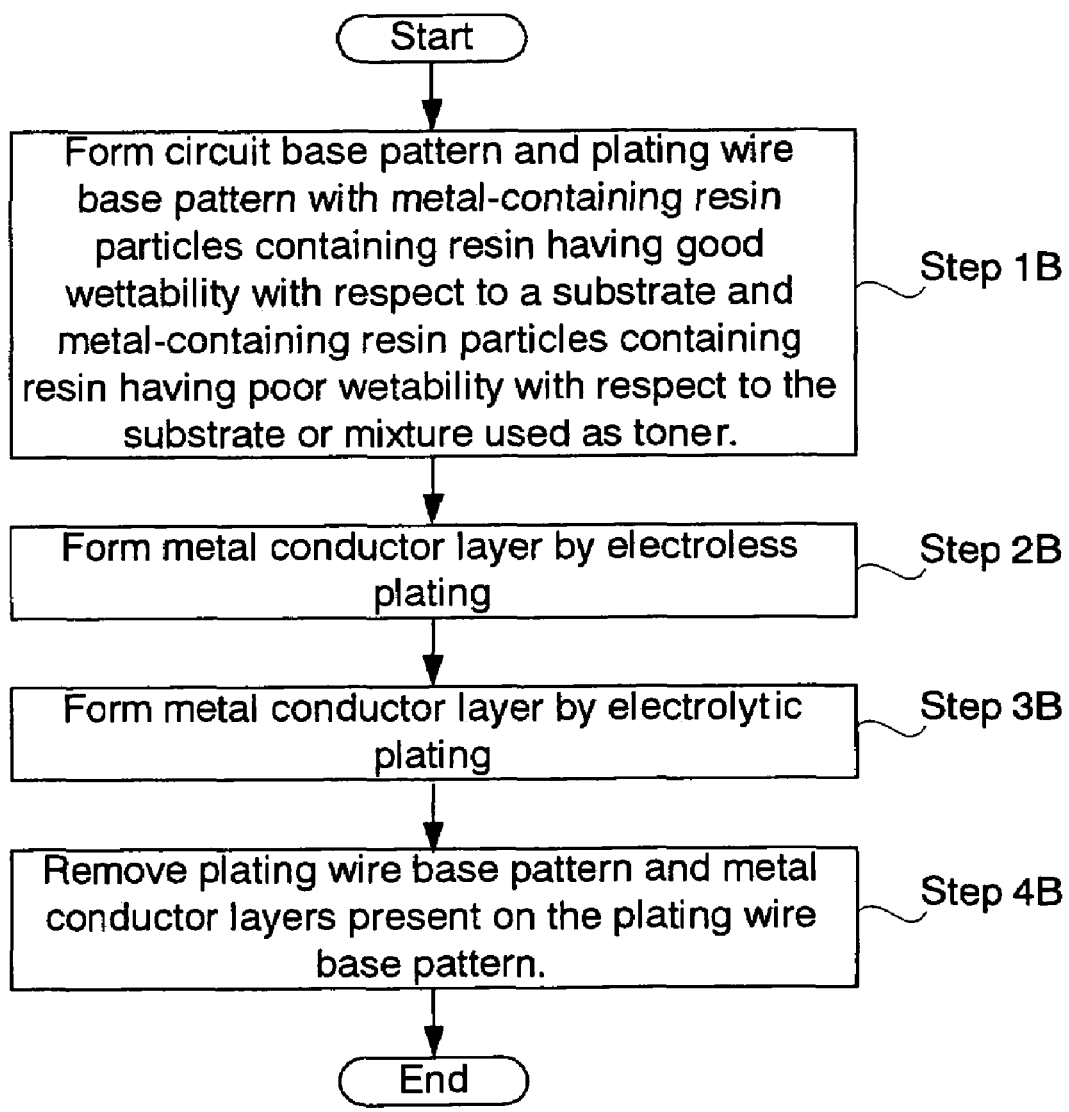
FIG. 7 is a flowchart showing a flow of manufacturing steps for the electronic circuit according to a second embodiment.

Second Embodiment will be described below. In this embodiment, an example that a resin having wettability with respect to a substrate lower than that of the resin for metal-containing resin particles for forming a circuit base pattern or a mixture of a resin with oils and fats is used as a constituent of metal-containing resin particles for forming a plating wire base pattern will be described. FIG. 7 is a flowchart showing a flow of manufacturing steps for the electronic circuit according to this embodiment, FIG. 8A and FIG. 8B are a plan view and a vertical sectional view schematically showing a manufacturing state of the electronic circuit according to this embodiment, and FIG. 9A and FIG. 9B are schematic views of the metal-containing resin particles according to this embodiment.

Figure 8A:
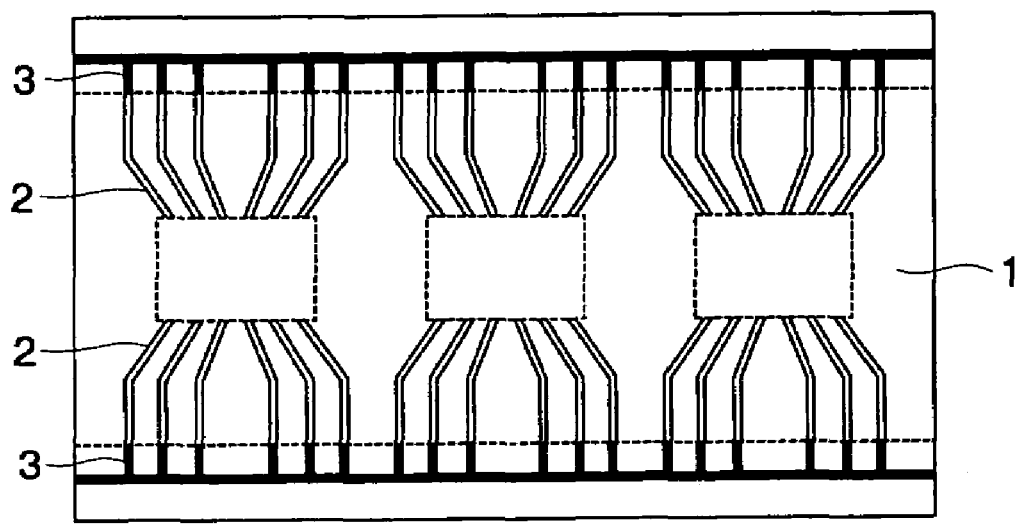
FIG. 8A and FIG. 8B are a plan view and a vertical sectional view schematically showing a manufacturing state of the electronic circuit according to the second embodiment.
Figure 8B:
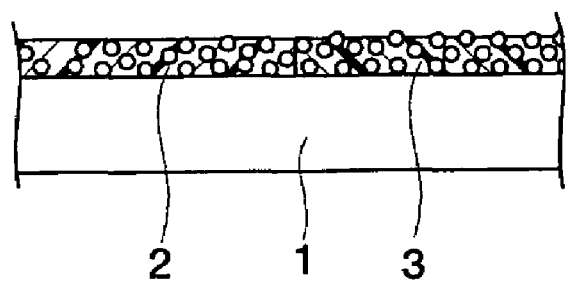

First, as shown in FIG. 7., FIG. 8A and FIG. 8B, a circuit base pattern 2 (first base pattern) for electroless plating is formed on a substrate 1 using metal-containing resin particles 2D (shown in FIG. 9A) as toner by printing according to electrophotography, and a plating wire base pattern 3 (second base pattern) for electroless plating is formed on the substrate 1 using metal-containing resin particles 3D (shown in FIG. 9B) as toner by printing according to electrophotography (step 1B). The circuit base pattern 2 and the plating wire base pattern 3 may be formed at the same time, or the circuit base pattern 2 may be formed after forming the plating wire base pattern 3.

Figure 9A:
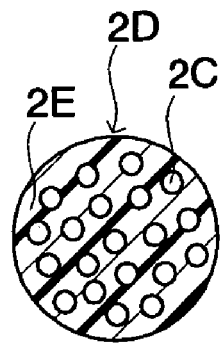
FIG. 9A and FIG. 9B are schematic views of metal-containing resin particles according to the second embodiment.

The metal-containing resin particles 2D are composed of a resin 2E (first resin) having good wettability with respect to the substrate 1 and fine metal particles 2C contained in the resin 2E as shown in FIG. 9A. As the resin 2D, a resin of the same system as the resin configuring the substrate 1 can be used when the substrate 1 is formed of the resin. Specifically, when the substrate 1 is formed of an epoxy resin or the like, an epoxy resin or the like can be used as the resin 2D.

Figure 9B:
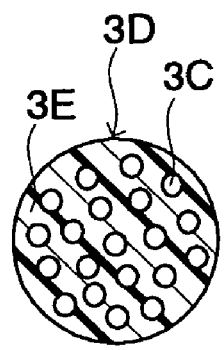

The metal-containing resin particles 3D are composed of a resin (second resin) having wettability with respect to the substrate 1 lower than that of the resin 2E, or a mixture 3E of a resin and oils and fats such as fatty acid which is low in compatibility with resins, and fine metal particles 3C which are contained in the resin or the mixture 3E as shown in FIG. 9B. When the substrate 1 is epoxy resin or the like and the resin 2E is epoxy resin or the like, a resin or oils and fats such as fatty acid can be used as the mixture 3E.

An electroless plating solution is supplied onto the substrate 1, and the metal conductor layer 4 is formed on the circuit base pattern 2 and the plating wire base pattern 3 by electroless plating (step 2B).

After the metal conductor layer 4 is formed on the circuit base pattern 2 and the plating wire base pattern 3, the electrolytic plating solution is supplied onto the substrate 1, and electric current is supplied from a portion of the metal conductor layer 4 which is present on the circuit base pattern 2 and the plating wire base pattern 3 to form the metal conductor layer 5 on the metal conductor layer 4 by electrolytic plating (step 3B).

After the metal conductor layer 5 is formed on the metal conductor layer 4, the substrate 1 is subjected to ultrasonic cleaning to remove the plating wire base pattern 3 and the metal conductor layers 4, 5 which are present on the plating wire base pattern 3 (step 4B).

In this embodiment, the resin or the mixture 3E having wettability to the substrate 1 lower than that of the resin 2E is used to form the plating wire base pattern 3, so that the metal conductor layers 4, 5 present on the plating wire base pattern 3 can be removed easily. In other words, when a stress is applied to the substrate 1 by ultrasonic cleaning or the like after the metal conductor layer 5 is formed, the plating wire base pattern 3 having low wettability is separated from the substrate 1. Thus, the metal conductor layers 4, 5 on the plating wire base pattern 3 can also be removed easily from the substrate 1.

(Third Embodiment)

Figure 10:
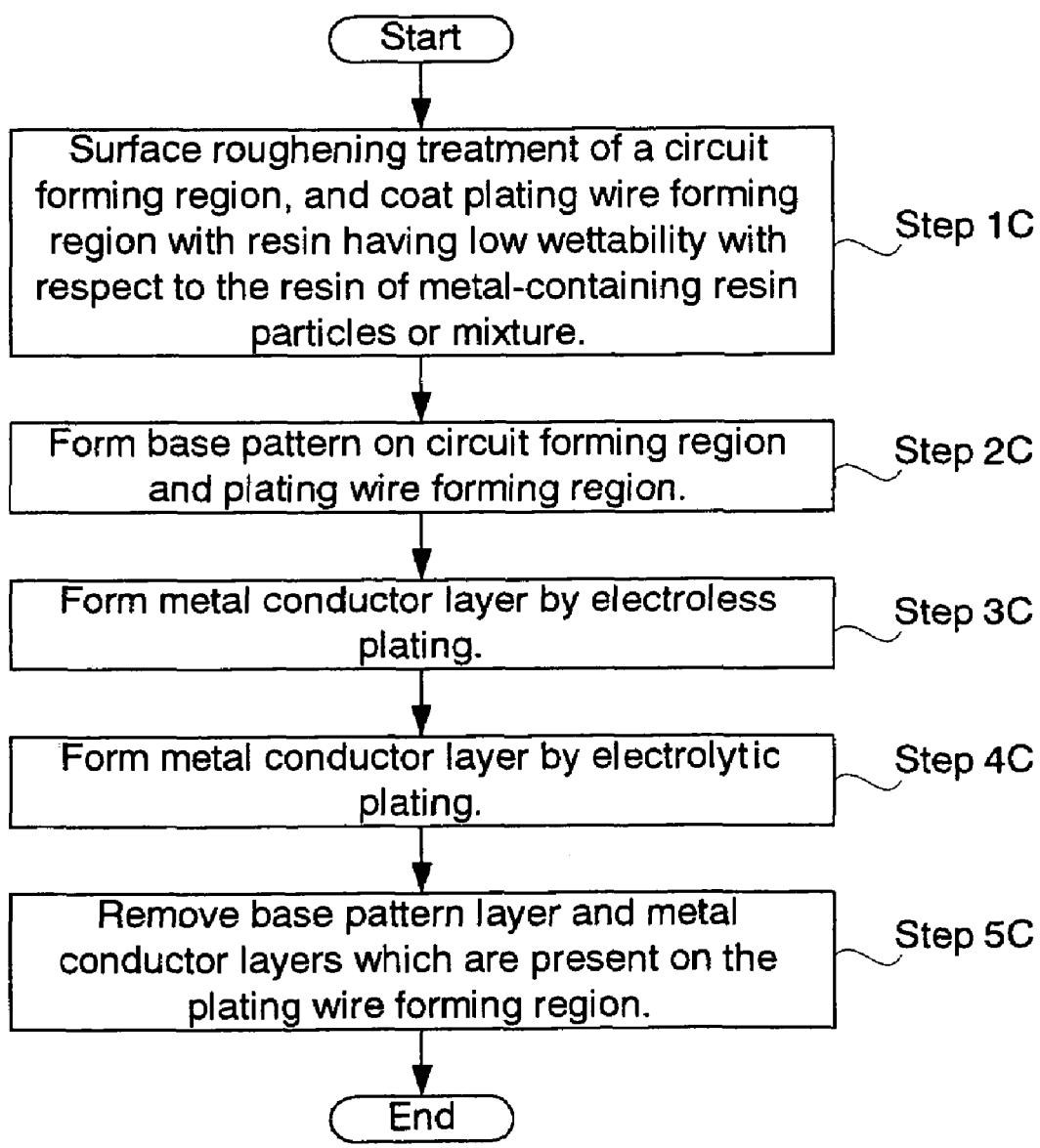
FIG. 10 is a flowchart showing a flow of manufacturing steps for the electronic circuit according to a third embodiment.

Third Embodiment will be described below. In this embodiment, an example that the circuit forming region of a substrate is undergone a surface roughening treatment and the plating wire forming region of the substrate is coated with a resin having low wettability with respect to a synthetic resin of metal-containing resin particles or a mixture of a resin and oils and fats will be described. FIG. 10 is a flowchart showing a flow of manufacturing steps for the electronic circuit according to this embodiment, FIG. 11A to FIG. 12B are plan views and vertical sectional views schematically showing manufacturing states of the electronic circuit according to this embodiment, and FIG. 13 is a schematic view of the metal-containing resin particles according to this embodiment.

Figure 11A:
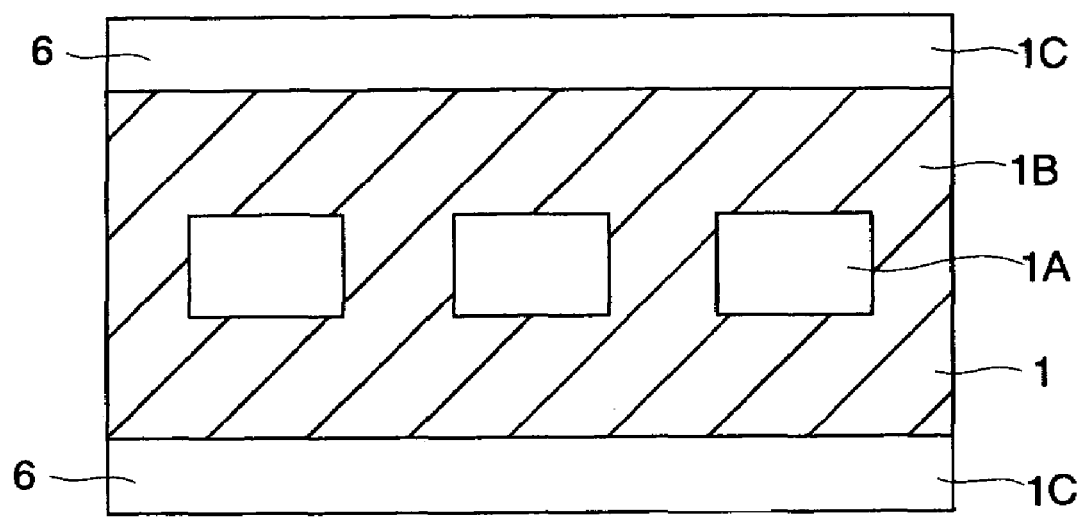
FIG. 11A and FIG. 11B are a plan view and a vertical sectional view schematically showing a manufacturing state of the electronic circuit according to the third embodiment.
Figure 11B:
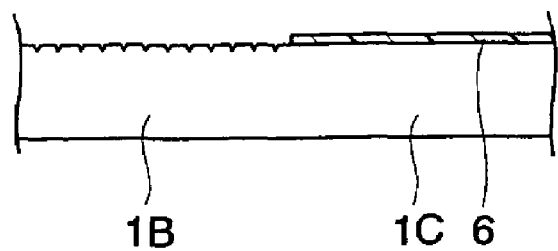

First, as shown in FIG. 10, FIG. 11A and FIG. 11B, a circuit forming region 1B which is present around a semiconductor device mounting region 1A of the substrate 1 is undergone a surface roughening treatment (surface treatment) to improve its wettability with respect to a resin 7B described later. And, the plating wire forming region 1C of the substrate 1 is coated (surface treatment) with a resin having low wettability with respect to the resin 7B or a mixture 6 of a resin and oils and fats such as fatty acid having low compatibility with resins so as to lower the wettability with respect to the resin 7B (step C). The surface roughening treatment and the coating with the mixture 6 may be conducted at the same time or the surface roughening treatment of the circuit forming region 1B may be performed after the plating wire forming region 1C is coated with the mixture 6. The mixture 6 can be used as toner to form a pattern by printing according to electrophotography.

As the surface roughening treatment, there are plasma processing, etching treatment and the like. Here, it is desirable that a surface roughness Ra (Ra: surface roughness defined by JIS (Japanese Industrial Standard) B O601-1994) of the circuit forming region 1B which is undergone the surface roughening treatment is Ra $\leq 0.15$ μm in view of the adhesiveness. And, examples of the mixture 6 include a mixture of the resin 7B with oils and fats such as fluorine-based resin, fatty acid or the like.

Figure 12A:
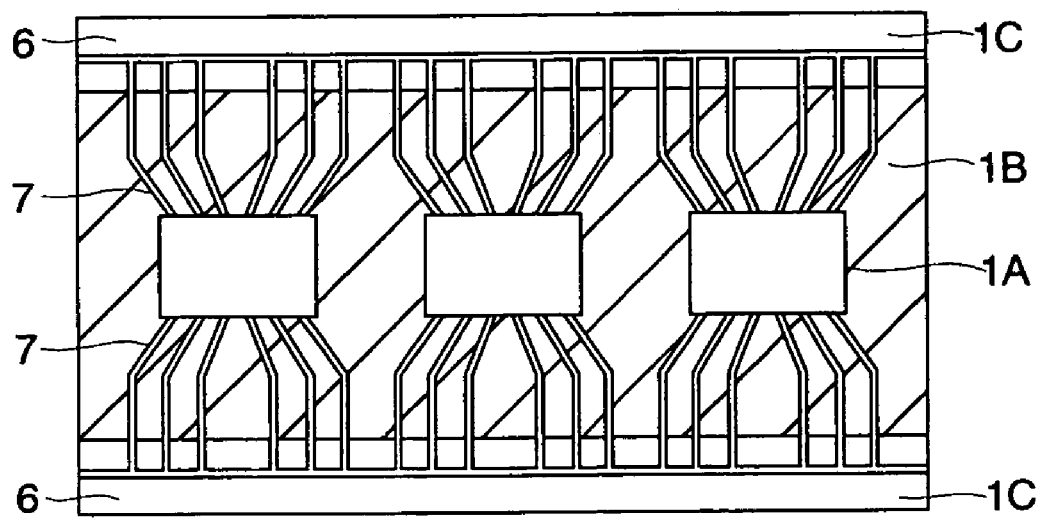
FIG. 12A and FIG. 12B are a plan view and a vertical sectional view schematically showing a manufacturing state of the electronic circuit according to the third embodiment.
Figure 12B:
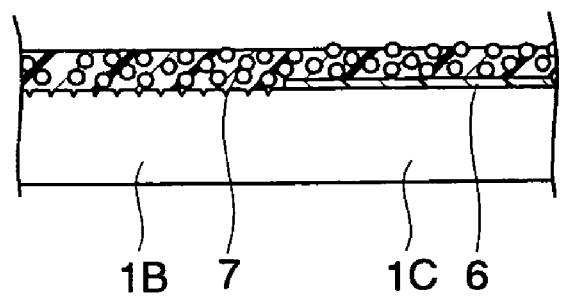
Figure 13:
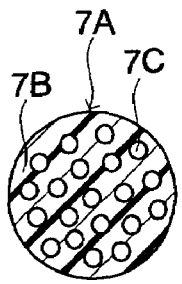
FIG. 13 is a schematic view of metal-containing resin particles according to the third embodiment.

Then, a base pattern 7 for electroless plating is formed on the circuit forming region 1B and the plating wire forming region 1C of the substrate 1 with the metal-containing resin particles 7A used as a toner by printing according to electrophotography as shown in FIG. 12A and FIG. 12B (step 2C).

The metal-containing resin particles 7A are composed of the resin 7B and the fine metal particles 7C contained in the resin 7B as shown in FIG. 13. In this embodiment, thermosetting resin is used for the resin 7B.

An electroless plating solution is supplied onto the substrate 1, and the metal conductor layer 4 is formed on the base pattern 7 by electroless plating (step 3C).

After the metal conductor layer 4 is formed on the base pattern 7, the electrolytic plating solution is supplied onto the substrate 1, and electric current is supplied from the metal conductor layer 4 which is present on the base pattern 7 to form the metal conductor layer 5 on the metal conductor layer 4 by electrolytic plating (step 4C).

After the metal conductor layer 5 is formed on the metal conductor layer 4, the substrate 1 is subjected to ultrasonic cleaning to remove the base pattern 7 and the metal conductor layers 4, 5 which are present on the plating wire forming region 1C (step 5C).

In this embodiment, the circuit forming region 1B is undergone the surface roughening treatment and the plating wire forming region. C is coated with the resin or the mixture 6 which has low wettability with respect to the resin 7B, so that the metal conductor layers 4, 5 which are on the plating wire forming region 1C can be removed easily. In other words, when a stress is applied to the substrate 1 by ultrasonic cleaning or the like after the metal conductor layer 5 is formed, the base pattern 7 comes off the substrate 1. Thus, the metal conductor layers 4, 5 which are on the plating wire forming region 1C can also be removed easily from the substrate 1.

EXPERIMENT EXAMPLE 1

Experiment Example 1 will be described below. In this experiment example, it was examined whether the metal conductor layer which was on the plating wire forming region could be removed while leaving the metal conductor layer which was on the circuit forming region.

In this experiment example, an electronic circuit produced by substantially the same procedure as that in the above-described third embodiment was used. Specifically, the circuit forming region of a substrate was undergone a surface roughening treatment, and the plating wire forming region of the substrate was coated with a mixture of a resin and oils and fats such as fatty acid which had low compatibility with respect to resins. Then, a base pattern for electroless plating was formed on the circuit forming region and the plating wire forming region, and the base pattern was undergone electroless plating for about one hour to form a 2 μm thick metal conductor layer on the base pattern. The metal conductor layer was subjected to electrolytic plating with an electric current density of 1 A/dm$^2$ between the metal conductor layer and the opposed electrode for about 20 minutes to form a metal conductor layer having a thickness of about 15 μm on the metal conductor layer. The electronic circuit was immersed together with the substrate in pure water, ultrasonic waves were applied at 200 W for 20 minutes, and the metal conductor layer which was present on the circuit forming region and the plating wire forming region was examined for peeling.

The results will be described below. The metal conductor layer which was on the circuit forming region was not peeled. Meanwhile, the metal conductor layer which was on the plating wire forming region was mostly peeled but remained to some extent. The metal conductor layer remaining on the plating wire forming region could be removed completely by an adhesive tape. It was assured from the result that the metal conductor layer present on the plating wire forming region could be removed by the above-described manufacturing method while remaining the metal conductor layer which was present on the circuit forming region.

(Fourth Embodiment)

Figure 14:
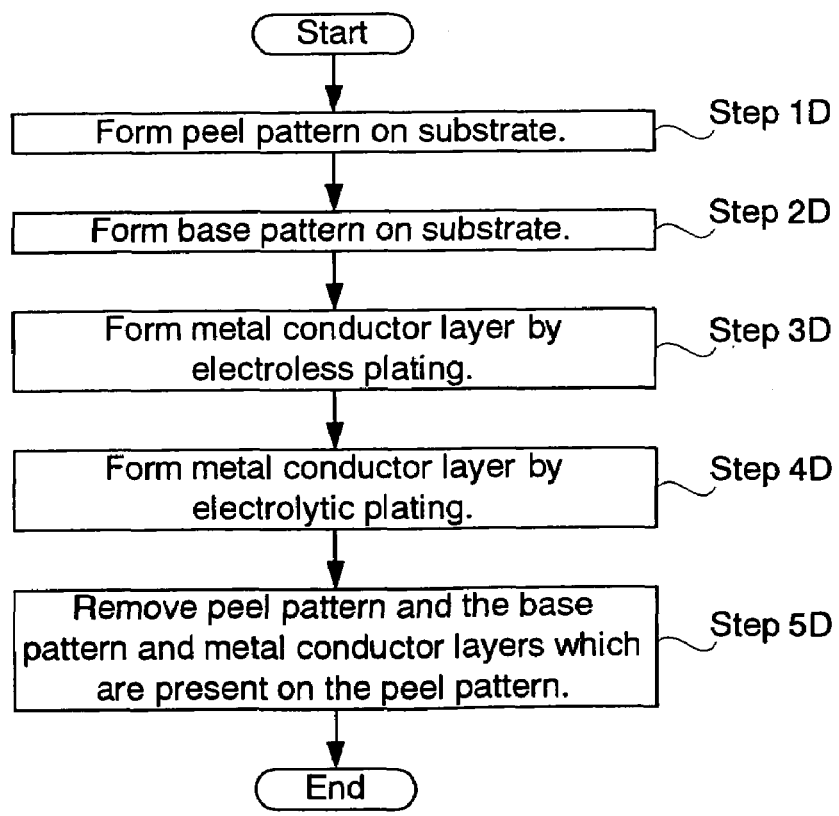
FIG. 14 is a flowchart showing a flow of manufacturing steps for the electronic circuit according to a fourth embodiment.
Figure 15A:
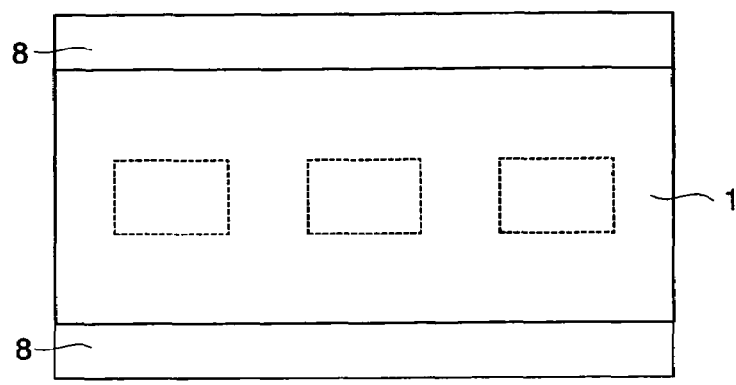
FIG. 15A and FIG. 15B are a plan view and a vertical sectional view schematically showing a manufacturing state of the electronic circuit according to the fourth embodiment.
Figure 15B:
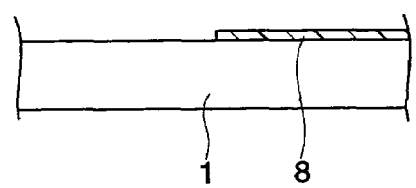

Fourth Embodiment will be described below. In this embodiment, an example of forming a peel pattern composed of a resin which has wettability with respect to the substrate lower than that of the resin for the metal-containing resin particles or a mixture of a resin and oils and fats on at least a part of the substrate will be described. FIG. 14 is a flowchart showing a flow of the manufacturing steps for the electronic circuit according to this embodiment, FIG. 15A and FIG. 15B are a plan view and a vertical sectional view schematically showing the manufacturing state of the electronic circuit according to this embodiment, and FIG. 16 is a schematic view of resin particles according to this embodiment.

Figure 16:
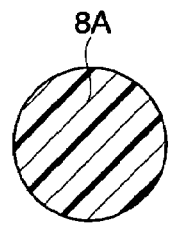
FIG. 16 is a schematic view of resin particles according to the fourth embodiment.

First, a peel pattern 8 is formed on at least a part of the substrate 1 with resin particles 8A used as toner by printing according to electrophotography as shown in FIG. 14 to FIG. 16 (step 1D).

The resin particles 8a are composed of a resin (second resin) having wettability with respect to the substrate 1 lower than that of the resin 7B (first resin) or a mixture of a resin and oils and fats. For example, the substrate 1 is formed of a thermosetting resin or a resin having many hydrophilic groups, and when the resin 7B is a thermosetting resin, a thermoplastic resin, which is soluble in a solvent, such as an acrylic resin can be used for the resin particles 8A.

Then, the base pattern 7 is formed on the substrate 1 with the metal-containing resin particles used as toner by printing according to electrophotography (step 2D).

An electroless plating solution is supplied onto the substrate 1, and the metal conductor layer 4 is formed on the base pattern 7 by electroless plating (step 3D).

After the metal conductor layer 4 is formed on the base pattern 7, the electrolytic plating solution is supplied onto the substrate 1, and electric current is supplied from the metal conductor layer 4 which is on the base pattern 7 to form the metal conductor layer 5 on the metal conductor layer 4 by electrolytic plating (step 4D).

After the metal conductor layer 5 is formed on the metal conductor layer 4, the peel pattern 8 is etched with a solvent such as acetone to remove the peel pattern 8 and also the base pattern 7 and the metal conductor layers 4, 5 which are present on the peel pattern 8 (step 5D).

In this embodiment, the peel pattern 8 is formed on at least a part of the substrate 1 by using the resin particles 8A having wettability with respect to the substrate 1 lower than that of the resin 7B, so that the metal conductor patterns 4, 5 which are present on the peel pattern 8 can be removed easily. In other words, when the peel pattern 8 is etched after the metal conductor layers 4, 5 are formed, the peel pattern 8 and the base pattern 7 which is on the peel pattern 8 are separated from the substrate 1. Thus, the metal conductor layers 4, 5 on the base pattern 7 can also be removed easily from the substrate 1.

EXPERIMENT EXAMPLE 2

Experiment Example 2 will be described below. In this experiment example, it was examined whether the metal conductor layer which was present on the peel pattern could be removed.

In this experiment example, an electronic circuit produced by substantially the same procedure as that in the above-described fourth embodiment was used. Specifically, a peel pattern was formed on at least a part of the substrate, a base pattern for electroless plating was formed on the substrate, the base pattern was undergone the electroless plating for about one hour to form a 2 μm thick metal conductor layer on the base pattern, and the metal conductor layer was subjected to electrolytic plating with an electric current density of 1 A/dm$^2$ between the metal conductor layer and the opposed electrode for about 20 minutes to form a metal conductor layer having a thickness of about 15 μm on the metal conductor layer. The peel pattern of the substrate on which the metal conductor layer and the like were formed was etched with acetone, and the metal conductor layer was examined for peeling.

The results will be described below. The metal conductor layer which was present on the peel pattern was mostly peeled but remained to some extent. The remaining metal conductor layer could be peeled completely by pressing a flat plate to the entire substrate to crush the metal conductor layer and cleaning the surface of the substrate. It was assured from the result that the metal conductor layer which was present on the peel pattern could be removed easily.

(Fifth Embodiment)

Fifth Embodiment will be described below. In this embodiment, (1) an example of a combination of the first or second embodiment and the third embodiment, and (2) an example of a combination of the first or second embodiment and the fourth embodiment will be described.

(1) Example of a Combination of the First or Second Embodiment and the Third Embodiment First, the circuit forming region 1B of the substrate 1 is undergone a surface roughening treatment to improve wettability with respect to the resin 7B, and the plating wire forming region 1C of the substrate 1 is coated with a resin or a mixture 6 of the resin and oils and fats such as fatty acid having low compatibility with resins. Then, the circuit base pattern 2 and the plating wire base pattern 3 are formed on the substrate 1 by printing according to electrophotography. Then, the metal conductor layers 4, 5 are formed, then the plating wire base pattern 3 and the metal conductor layers 4, 5 which are present on the plating wire base pattern 3 are removed.

(2) Example of a Combination of the First or Second Embodiment and the Fourth Embodiment First, the peel pattern 8 is formed on at least a part of the substrate 1. Then, the circuit base pattern 2 and the plating wire base pattern 3 are formed on the substrate 1 by printing according to electrophotography. The metal conductor layers 4, 5 are formed, and the peel pattern 8, the plating wire base pattern 3 and the metal conductor layers 4, 5 present on the plating wire base pattern 3 are removed.

The present invention is not limited to the described contents of the above embodiments, and the structure, materials, arrangement of individual members and the like may be modified appropriately without deviating from the spirit and scope of the present invention. In the third embodiment, the circuit forming region 1B is undergone the surface roughening treatment, but when the plating wire forming region 1C is coated with the mixture 6, the circuit forming region 1B is not required to be undergone the surface roughening treatment. The plating wire forming region 1C is coated with the mixture 6, but if the circuit forming region 1B is undergone the surface roughening treatment, it is not necessary to coat the plating wire forming region 1C with the mixture 6.

What is claimed is:

1. A method of producing an electronic circuit, comprising:
    printing first metal-containing resin particles which consist of at least a thermosetting resin and fine metal particles and second metal-containing resin particles which consist of at least a thermoplastic resin and fine metal particles by electrophotography to form a first base pattern which consists of the first metal-containing resin particles and a second base pattern which consists of the second metal-containing resin particles on a substrate;
    forming a first metal conductor layer on the first and second base patterns;
    forming a second metal conductor layer on the first metal conductor layer by electrolytic plating by supplying electric current to the first metal conductor layer; and
    removing the second base pattern and the first and second metal conductor layers which are formed on the second base pattern.

2. A method of producing an electronic circuit, comprising:
    printing first metal-containing resin particles which consist of at least a first resin and fine metal particles and second metal-containing resin particles which consist of either a second resin having wettability with respect to a substrate relatively lower than that of the first resin or a mixture containing a resin and oils and fats, and fine metal particles by electrophotography to form a first base pattern which consists of the first metal-containing resin particles and a second base pattern which consists of the second metal-containing resin particles on the substrate;
    forming a first metal conductor layer on the first and second base patterns;
    forming a second metal conductor layer on the first metal conductor layer by electrolytic plating by supplying electric current to the first metal conductor layer; and
    removing the second base pattern and the first and second metal conductor layers which are formed on the second base pattern.

3. A method of producing an electronic circuit, comprising:
    treating the surface of at least either of a circuit forming region of a substrate and a plating wire forming region of the substrate to make wettability of the plating wire forming region with respect to a resin lower than that of the circuit forming region;
    printing metal-containing resin particles which consist of at least the resin and fine metal particles contained in the resin by electrophotography to form a base pattern on the circuit forming region and the plating wire forming region;
    forming a first metal conductor layer on the base pattern;
    forming a second metal conductor layer on the first metal conductor layer by electrolytic plating by supplying an electric current to the first metal conductor layer; and
    removing the base pattern and the first and second metal conductor layers formed on the plating wire forming region.

4. A method of producing an electronic circuit, comprising:
    forming a peel pattern on a part of a substrate by using a second resin which has wettability with respect to the substrate lower than that of a first resin, or a mixture containing a resin and oils and fats;
    printing metal-containing resin particles which consist of at least the first resin and fine metal particles contained in the first resin by electrophotography to form a base pattern on the substrate;
    forming a first metal conductor layer on the base pattern;
    forming a second metal conductor layer on the first metal conductor layer by electrolytic plating by supplying electric current to the first metal conductor layer; and
    removing the peel pattern, and the base pattern and the first and second metal conductor layers which are formed on the peel pattern.

* * * * *